United States Patent
Wu

(10) Patent No.: US 11,839,050 B2
(45) Date of Patent: Dec. 5, 2023

(54) HEAT DISSIPATION MODULE AND ELECTRONIC DEVICE

(71) Applicant: Chang-Yuan Wu, Taipei (TW)

(72) Inventor: Chang-Yuan Wu, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 527 days.

(21) Appl. No.: 16/843,898

(22) Filed: Apr. 9, 2020

(65) Prior Publication Data
US 2020/0245498 A1 Jul. 30, 2020

Related U.S. Application Data

(63) Continuation-in-part of application No. 15/894,886, filed on Feb. 12, 2018, now abandoned.

(60) Provisional application No. 63/001,557, filed on Mar. 30, 2020, provisional application No. 62/547,065, filed on Aug. 17, 2017.

(51) Int. Cl.
*H05K 7/20* (2006.01)

(52) U.S. Cl.
CPC ..... *H05K 7/20145* (2013.01); *H05K 7/20154* (2013.01); *H05K 7/20445* (2013.01); *H05K 7/20172* (2013.01)

(58) Field of Classification Search
CPC ........... H05K 7/20145; H05K 7/20154; H05K 7/20445; H05K 7/20172; G06F 1/203
USPC ......................................................... 361/697
See application file for complete search history.

(56) References Cited

U.S. PATENT DOCUMENTS

| | | | | |
|---|---|---|---|---|
| 5,727,624 A | * | 3/1998 | Ko | H01L 23/467 257/E23.099 |
| 2008/0080136 A1 | * | 4/2008 | Chikazawa | G06F 1/1658 361/695 |
| 2008/0101017 A1 | * | 5/2008 | Hata | G06F 1/20 361/690 |
| 2008/0266796 A1 | * | 10/2008 | Iikubo | G06F 1/20 361/697 |
| 2009/0166010 A1 | * | 7/2009 | Chen | H01L 23/467 165/121 |

(Continued)

FOREIGN PATENT DOCUMENTS

| | | | | | |
|---|---|---|---|---|---|
| TW | I337699 B | * | 2/2011 | | G06F 1/20 |
| TW | I479984 B | * | 4/2015 | | H05K 7/20 |

*Primary Examiner* — Anatoly Vortman
*Assistant Examiner* — Zhengfu J Feng
(74) *Attorney, Agent, or Firm* — JCIPRNET

(57) ABSTRACT

A heat dissipation module adapted for an electronic device is provided. The heat dissipation module includes a heat dissipation structure and a heat dissipation fan. The heat dissipation structure is disposed in a casing of the electronic device and has a heat dissipation portion, wherein a heat dissipation flow channel is formed between the heat dissipation portion and the casing. The heat dissipation fan is adjacent to the heat dissipation portion, wherein the heat dissipation fan or the heat dissipation structure has an air flow guiding portion with a slot connected to the heat dissipation flow channel, the heat dissipation fan provides a heat dissipation air flow, and the air flow guiding portion guides a part of the heat dissipation air flow to pass through the slot along a direction not parallel to an outflow direction of the heat dissipation fan and then pass through the heat dissipation flow channel.

16 Claims, 6 Drawing Sheets

(56) References Cited

U.S. PATENT DOCUMENTS

| | | | | |
|---|---|---|---|---|
| 2010/0002391 A1* | 1/2010 | Jiang | .................... | H01L 23/467 |
| | | | | 361/697 |
| 2011/0043998 A1* | 2/2011 | Chu | .................... | H01L 23/467 |
| | | | | 361/697 |
| 2013/0286297 A1* | 10/2013 | Fujiwara | ................. | H04N 5/64 |
| | | | | 348/836 |
| 2013/0286588 A1* | 10/2013 | Wang | .................... | H01L 23/467 |
| | | | | 361/697 |
| 2015/0351280 A1* | 12/2015 | Gonzalez Inda | ....... | G06F 1/181 |
| | | | | 415/126 |

* cited by examiner

HEAT DISSIPATION MODULE AND ELECTRONIC DEVICE

CROSS-REFERENCE TO RELATED APPLICATION

This application is a continuation-in-part application of and claims the priority benefit of U.S. application Ser. No. 15/894,886, filed on Feb. 12, 2018, which claims the priority benefit of U.S. provisional application Ser. No. 62/547,065, filed on Aug. 17, 2017. This application also claims the priority benefit of U.S. provisional application Ser. No. 63/001,557, filed on Mar. 30, 2020. The entirety of each of the above-mentioned patent applications is hereby incorporated by reference herein and made a part of this specification.

BACKGROUND OF THE INVENTION

Field of the Invention

The invention relates to a heat dissipation module and an electronic device, particularly to a heat dissipation module and an electronic device having a heat dissipation fan.

Description of Related Art

In recent years, with the rapid development of technology, operation speed of electronic devices such as computers has continuously been increased, and heat emitted by a heating element inside the electronic devices has continuously increased. In order to prevent overheating and the resultant temporary or permanent malfunction of the electronic devices, it becomes very important to perform heat dissipation on the heating element inside the electronic devices. In addition, heat energy generated by the heating element may be transmitted to a casing of the electronic devices to cause overheating of the casing. Hence, heat dissipation is also required for casings of some electronic devices. Therefore, how to improve heat dissipation efficiency of a heat dissipation module with respect to the heating element inside the electronic devices and the casing of the electronic devices is an important issue in design of heat dissipation modules.

SUMMARY OF THE INVENTION

The invention provides a heat dissipation module exhibiting good heat dissipation efficiency with respect to a heating element inside an electronic device and a casing of the electronic device.

The invention provides an electronic device in which a heat dissipation module exhibits good heat dissipation efficiency with respect to a heating element inside the electronic device and a casing of the electronic device.

A heat dissipation module according to the invention is adapted for an electronic device. The heat dissipation module includes a heat dissipation structure and a heat dissipation fan. The heat dissipation structure is disposed in a casing of the electronic device and has a heat dissipation portion, wherein a heat dissipation flow channel is formed between the heat dissipation portion and the casing. The heat dissipation fan is adjacent to the heat dissipation portion, wherein the heat dissipation fan or the heat dissipation structure has an air flow guiding portion, the air flow guiding portion has a slot, the slot is connected to the heat dissipation flow channel, the heat dissipation fan is adapted to provide a heat dissipation air flow, and the air flow guiding portion is adapted to guide a part of the heat dissipation air flow to pass through the slot along a direction not parallel to an outflow direction of the heat dissipation fan and then pass through the heat dissipation flow channel.

An electronic device according to the invention includes a casing and a heat dissipation module. The heat dissipation module includes a heat dissipation structure and a heat dissipation fan. The heat dissipation structure is disposed in the casing and has a heat dissipation portion, wherein a heat dissipation flow channel is formed between the heat dissipation portion and the casing. The heat dissipation fan is adjacent to the heat dissipation portion, wherein the heat dissipation fan or the heat dissipation structure has an air flow guiding portion, the air flow guiding portion has a slot, the slot is connected to the heat dissipation flow channel, the heat dissipation fan is adapted to provide a heat dissipation air flow, and the air flow guiding portion is adapted to guide a part of the heat dissipation air flow to pass through the slot along a direction not parallel to an outflow direction of the heat dissipation fan and then pass through the heat dissipation flow channel.

In an embodiment of the invention, an end of a housing of the heat dissipation fan has a bent wall to form the air flow guiding portion, the bent wall is tilted relative to the outflow direction of the heat dissipation fan, and the slot is formed on the bent wall.

In an embodiment of the invention, the slot is formed on a housing of the heat dissipation fan, the housing has a tongue portion adjacent to the slot to form the air flow guiding portion, and the tongue portion is tilted relative to the outflow direction of the heat dissipation fan.

In an embodiment of the invention, the heat dissipation portion includes heat dissipation fins.

In an embodiment of the invention, the heat dissipation module includes a heat pipe disposed on the heat dissipation portion.

In an embodiment of the invention, the heat dissipation structure has an extending portion to form the air flow guiding portion, the extending portion has the slot, and the heat dissipation fan is detachably assembled to the extending portion and covers the slot.

In an embodiment of the invention, the heat dissipation structure has a contact portion, the contact portion contacts a heating element of the electronic device, and the extending portion is connected to the contact portion.

In an embodiment of the invention, the heat dissipation structure has a directing portion formed on the extending portion, the heat dissipation fan includes a fan blade structure, and a pressurization flow channel is formed between the directing portion and the fan blade structure.

In an embodiment of the invention, the extending portion has a plurality of studs thereon, and the heat dissipation fan is detachably screwed to the studs.

Based on the above, in the heat dissipation module according to the invention, the heat dissipation fan or the heat dissipation structure has the air flow guiding portion with the slot so that the heat dissipation air flow can flow to the heat dissipation flow channel between the heat dissipation portion and the casing via the slot. Thereby, heat dissipation efficiency of the heat dissipation fan with respect to the heat dissipation portion is improved. Moreover, the heat dissipation fan may perform heat dissipation on the casing to effectively lower the temperature of the casing. In addition, the heat dissipation fan may be detachably assembled to the extending portion of the heat dissipation structure, thus facilitating replacement and maintenance of the heat dissipation fan.

To make the above features and advantages of the invention more comprehensible, several embodiments accompanied with drawings are described in detail as follows.

DETAILED DESCRIPTION OF DISCLOSED EMBODIMENTS

Figure 1:
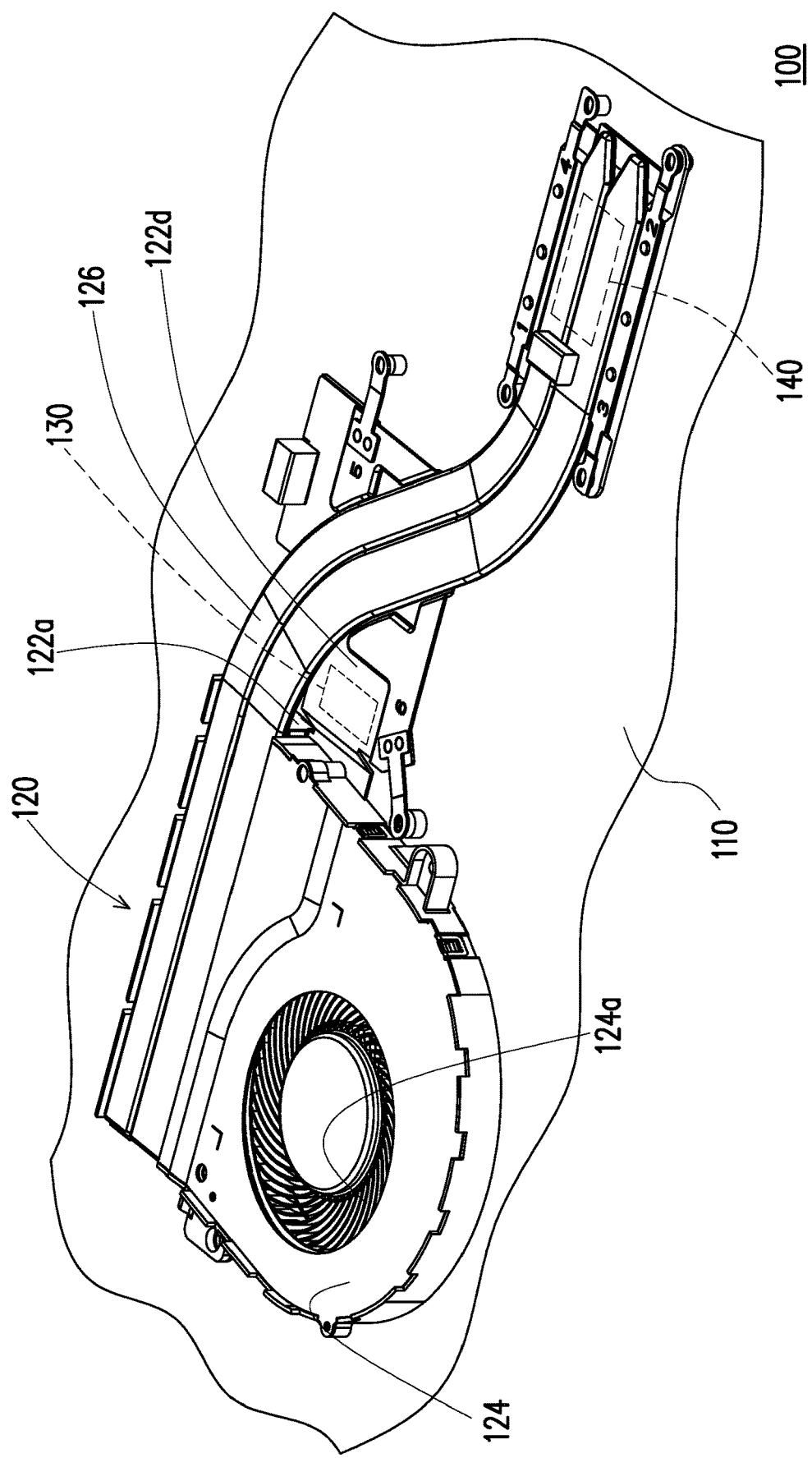
FIG. 1 is a partial three-dimensional view of an electronic device according to an embodiment of the invention.

FIG. 1 is a partial three-dimensional view of an electronic device according to an embodiment of the invention. Referring to FIG. 1, an electronic device 100 of the present embodiment includes a casing 110 and a heat dissipation module 120. The electronic device 100 is, for example, a notebook computer, and the casing 110 is, for example, a host casing of the notebook computer. For clearer illustration, only the bottom of the casing 110 is illustrated in FIG. 1. The heat dissipation module 120 is disposed at the casing 110 and is configured to perform heat dissipation on heating elements 130 and 140 in the casing 110. The heating elements 130 and 140 are, for example, central processing units (CPUs) or other types of processing chips of the notebook computer. In other embodiments, the electronic device 100 may be other types of devices, and the invention is not limited thereto.

Figure 2:
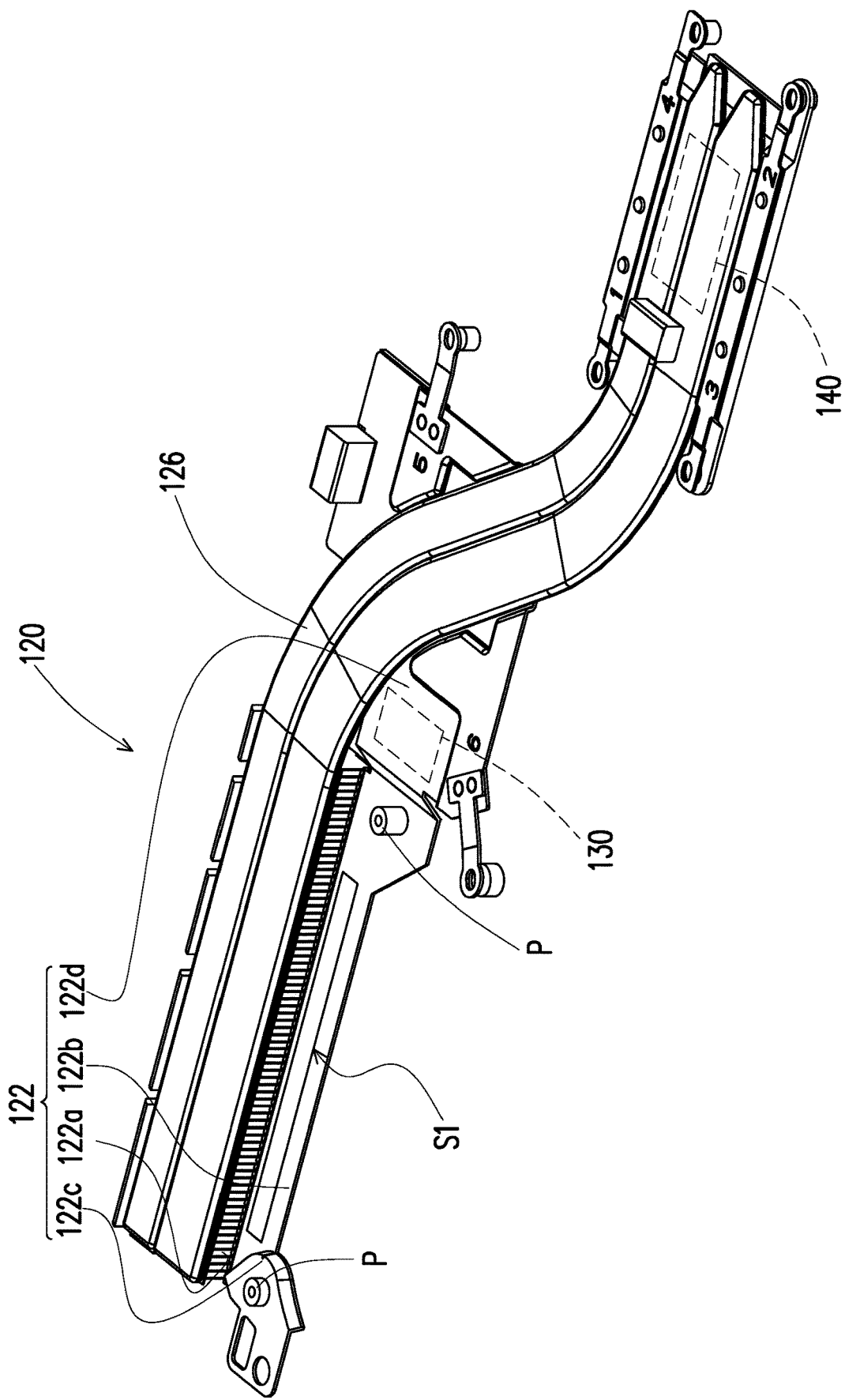
FIG. 2 is a three-dimensional view of some members of a heat dissipation module in FIG. 1.
Figure 3:
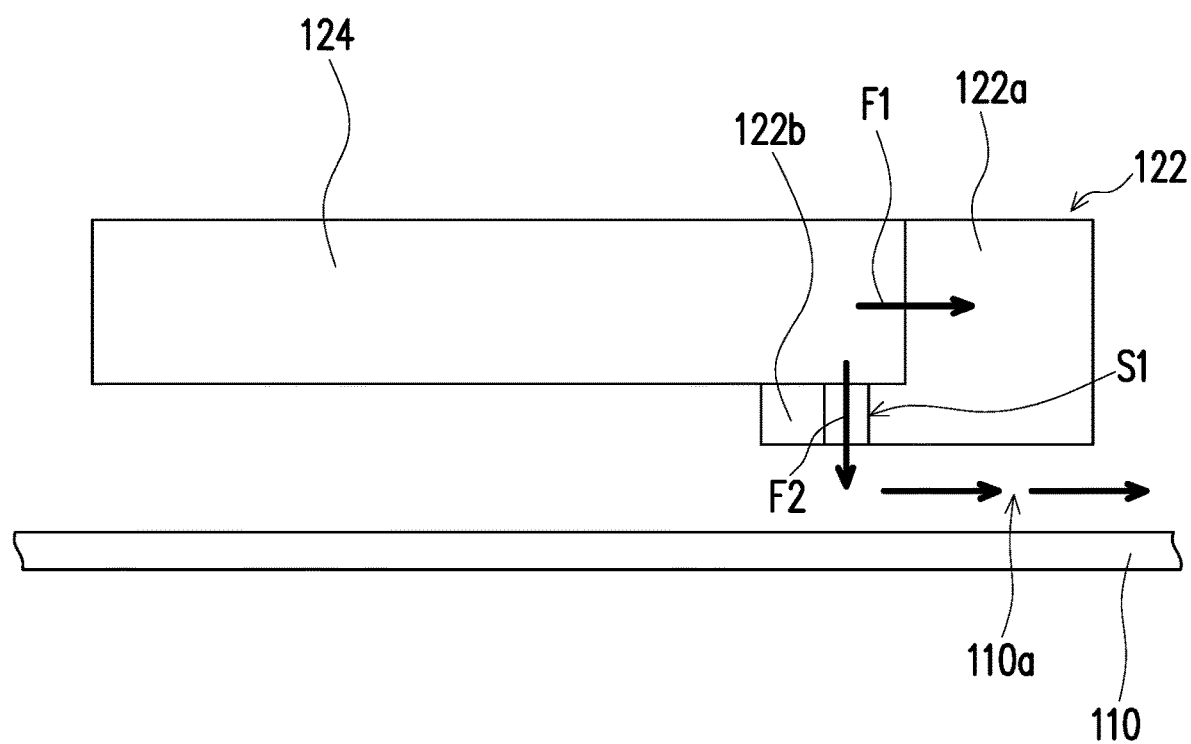
FIG. 3 is a partial schematic view of the electronic device in FIG. 1.

FIG. 2 is a three-dimensional view of some members of the heat dissipation module in FIG. 1. FIG. 3 is a partial schematic view of the electronic device in FIG. 1. Referring to FIG. 1 to FIG. 3, the heat dissipation module 120 includes a heat dissipation structure 122 and a heat dissipation fan 124. The heat dissipation structure 122 is disposed in the casing 110 and has a heat dissipation portion 122a and an extending portion 122b, wherein the heat dissipation portion 122a and the extending portion 122b are, for example, integrally connected to each other. The heat dissipation portion 122a is, for example, heat dissipation fins. The heat dissipation fan 124 is detachably assembled to the extending portion 122b to be adjacent to the heat dissipation portion 122a, and the heat dissipation fan 124 is configured to produce a heat dissipation air flow F1.

A heat dissipation flow channel 110a is formed between the heat dissipation portion 122a and the casing 110. The extending portion 122b forms an air flow guiding portion and has a slot S1, the heat dissipation fan 124 covers the slot S1 of the extending portion 122b, and the slot S1 is connected to the heat dissipation flow channel 110a between the heat dissipation portion 122a and the casing 110. The heat dissipation fan 124 provides a partial heat dissipation air flow F2 which is guided by the air flow guiding portion to pass through the slot S1 along a direction not parallel to (shown as perpendicular to) an outflow direction (the direction of the heat dissipation air flow F1) of the heat dissipation fan 124 and then pass through the heat dissipation flow channel 110a. Since the heat dissipation fan 124 not only produces the heat dissipation air flow F1 which flows to the heat dissipation portion 122a but also produces the heat dissipation air flow F2 which flows to the heat dissipation flow channel 110a between the heat dissipation portion 122a and the casing 110 via the slot S1, heat dissipation efficiency of the heat dissipation fan 124 with respect to the heat dissipation portion 122a is improved, and the heat dissipation fan 124 can thus perform heat dissipation on the casing 110 to effectively lower the temperature of the casing 110. In addition, the heat dissipation fan 124 is detachably assembled to the extending portion 122b of the heat dissipation structure 122, thus facilitating replacement and maintenance of the heat dissipation fan 124.

In the present embodiment, the extending portion 122b of the heat dissipation structure 122 has a plurality of (two are shown) studs P thereon, and the heat dissipation fan 124 is detachably screwed to these studs P. In other embodiments, the heat dissipation fan 124 may be assembled to the extending portion 122b of the heat dissipation structure 122 in other suitable manners, and the invention is not limited thereto.

Hereinafter, how the heat dissipation module 120 performs heat dissipation on the heating elements 130 and 140 is described in detail. The heat dissipation module 120 includes a heat pipe 126. The heat pipe 126 is disposed on the heat dissipation portion 122a of the heat dissipation structure 122 and extends to the heating element 130 and also to the heating element 140. Heat generated by the heating elements 130 and 140 is transmitted to the heat dissipation portion 122a of the heat dissipation structure 122 via the heat pipe 126, and is dissipated at the heat dissipation portion 122a by the heat dissipation air flow F1 produced by the heat dissipation fan 124. In addition, the heat dissipation structure 122 of the present embodiment has a contact portion 122d. The contact portion 122d contacts the heating element 130, and the extending portion 122b is connected to the contact portion 122d. In this way, the heat generated by the heating element 130 may be transmitted to the heat dissipation portion 122a not only via the heat pipe 126 but also via the contact portion 122d and the extending portion 122b, thereby improving heat dissipation efficiency of the heat dissipation module 120 with respect to the heating element 130.

Figure 4:
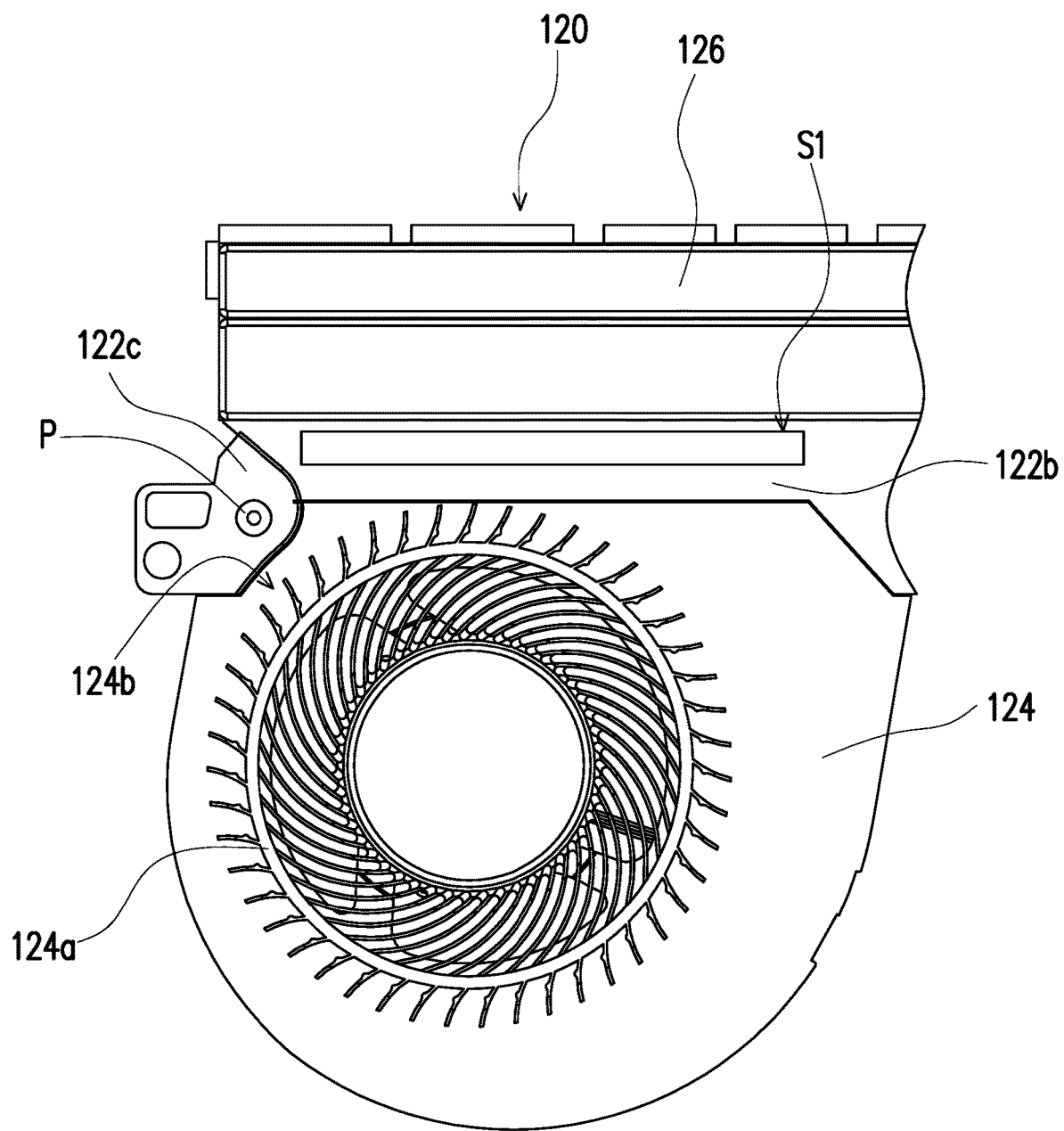
FIG. 4 is a top view of some members of the heat dissipation module in FIG. 1.

FIG. 4 is a top view of some members of the heat dissipation module in FIG. 1. Referring to FIG. 2 and FIG. 4, the heat dissipation structure 122 of the present embodiment has a directing portion 122c. The directing portion 122c is formed on the extending portion 122b. A pressurization flow channel 124b is formed between the directing portion 122c and a fan blade structure 124a of the heat dissipation fan 124, and is configured to perform pressurization on a heat dissipation air flow produced by the fan blade structure 124a. In this way, the heat dissipation fan 124 itself does not require a directing portion, thus increasing flexibility in designing the heat dissipation module 120.

Figure 5:
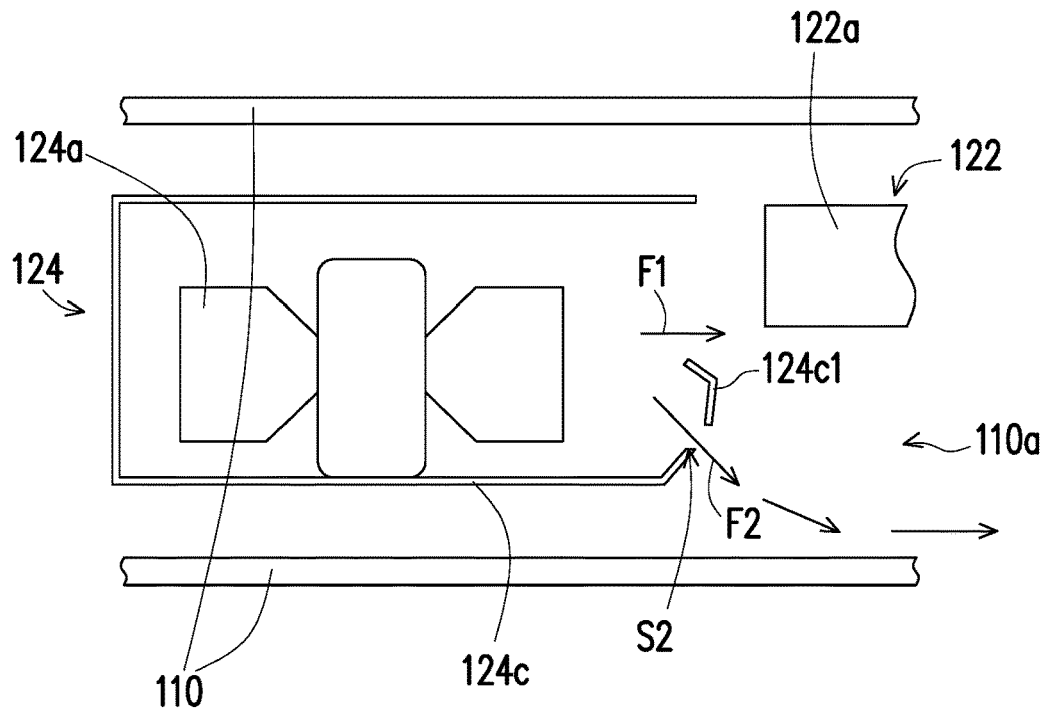
FIG. 5 is a partial schematic view of the electronic device according to another embodiment of the invention.
Figure 6:
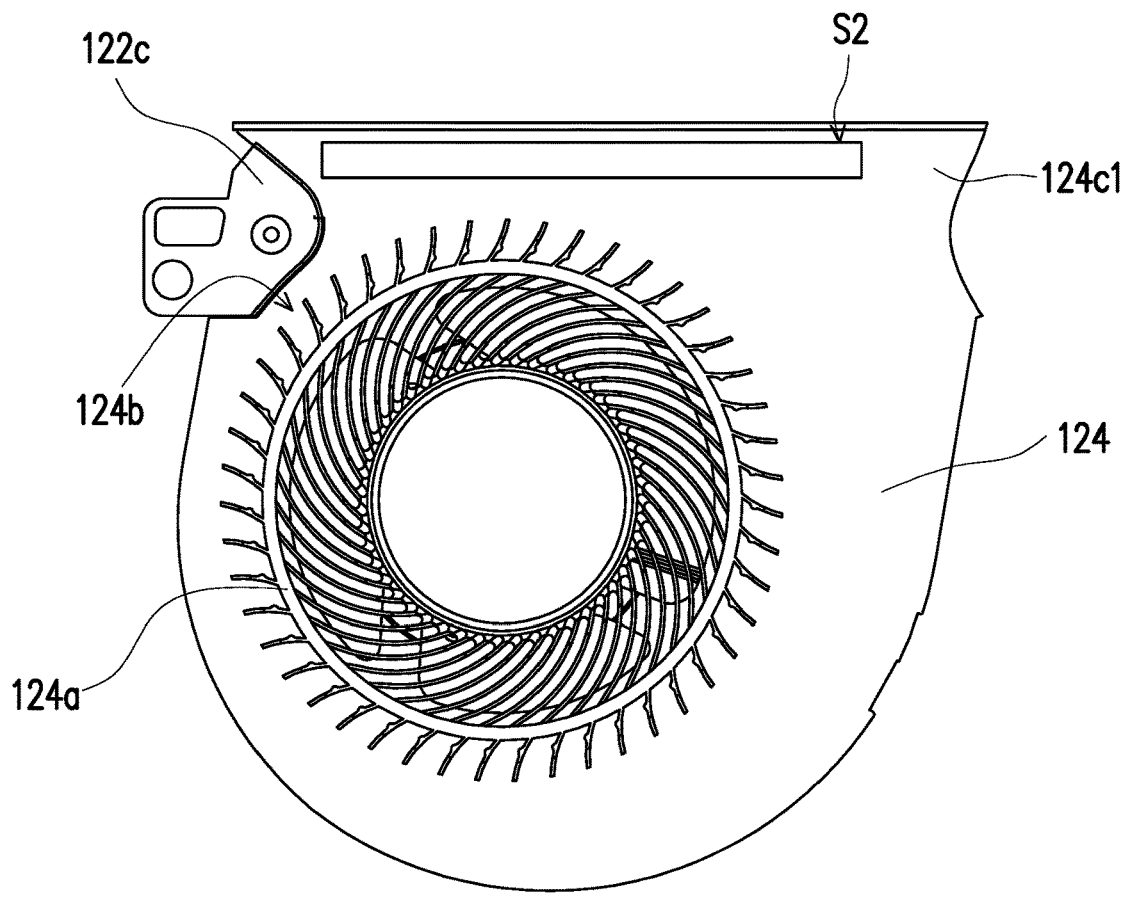
FIG. 6 is a top view of some members of the heat dissipation module in FIG. 5.

FIG. 5 is a partial schematic view of the electronic device according to another embodiment of the invention. FIG. 6 is a top view of some members of the heat dissipation module in FIG. 5. The difference between the embodiment of FIGS. 5 and 6 and the embodiment of FIGS. 1 to 4 is that, in the embodiment of FIGS. 5 and 6, an end of the housing 124c of the heat dissipation fan 124 has a bent wall 124c1 to form the air flow guiding portion. At least a part of the bent wall 124c1 is tilted relative to the outflow direction (the direction of the heat dissipation air flow F1) of the heat dissipation fan 124, and a slot S2 is formed on the bent wall 124c1 for the heat dissipation air flow F2 to pass through along a direction not parallel to (shown as tilted relative to) the outflow direction (the direction of the heat dissipation air flow F1) of the heat dissipation fan 124 by the guiding of the bent wall 124c1 and then pass through the heat dissipation flow channel 110a. In the embodiment, the tilted angle of the bent wall 124c1 relative to the outflow direction of the heat dissipation fan 124 is, for example, 0 degree to 90 degree. In a preferable embodiment, the tilted angle of the bent wall 124c1 may be 30 degree to 60 degree.

Figure 7:
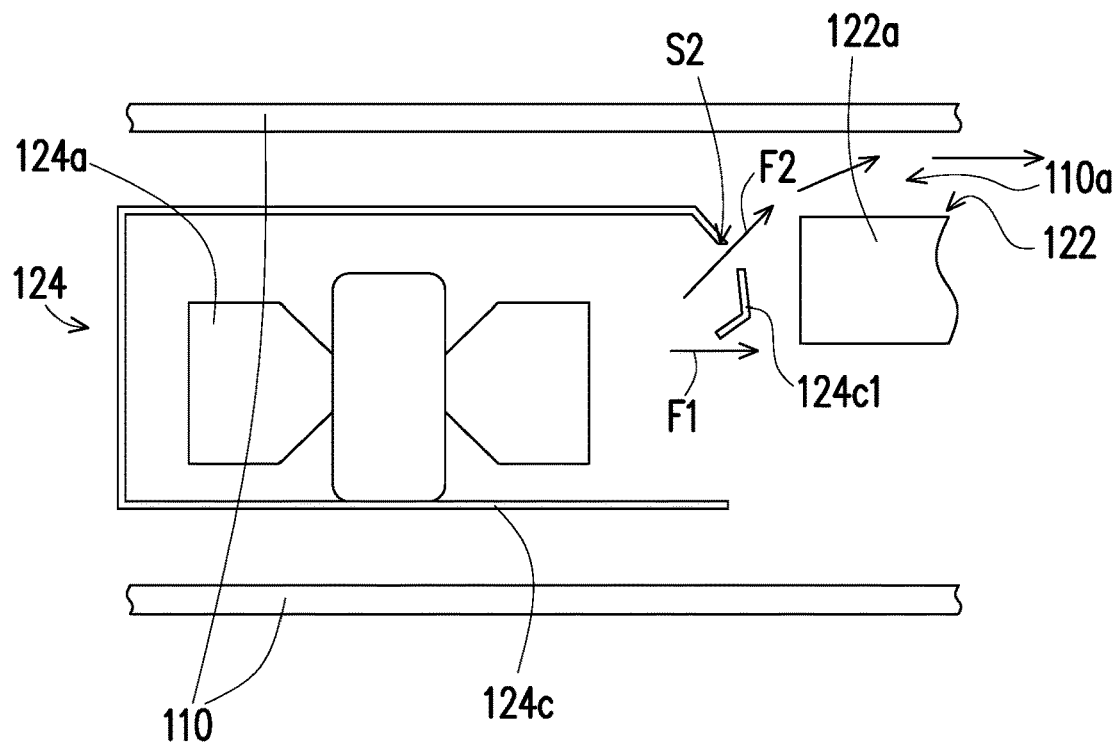
FIG. 7 is a partial schematic view of the electronic device according to another embodiment of the invention.

FIG. 7 is a partial schematic view of the electronic device according to another embodiment of the invention. The difference between the embodiment of FIG. 7 and the embodiment of FIG. 5 is that, the bent wall 124c1 and the slot S2 thereon in the embodiment of FIG. 7 are formed at the top side of the housing 124c while the bent wall 124c1 and the slot S2 thereon in the embodiment of FIG. 5 are formed at the bottom side of the housing 124c.

Figure 8:
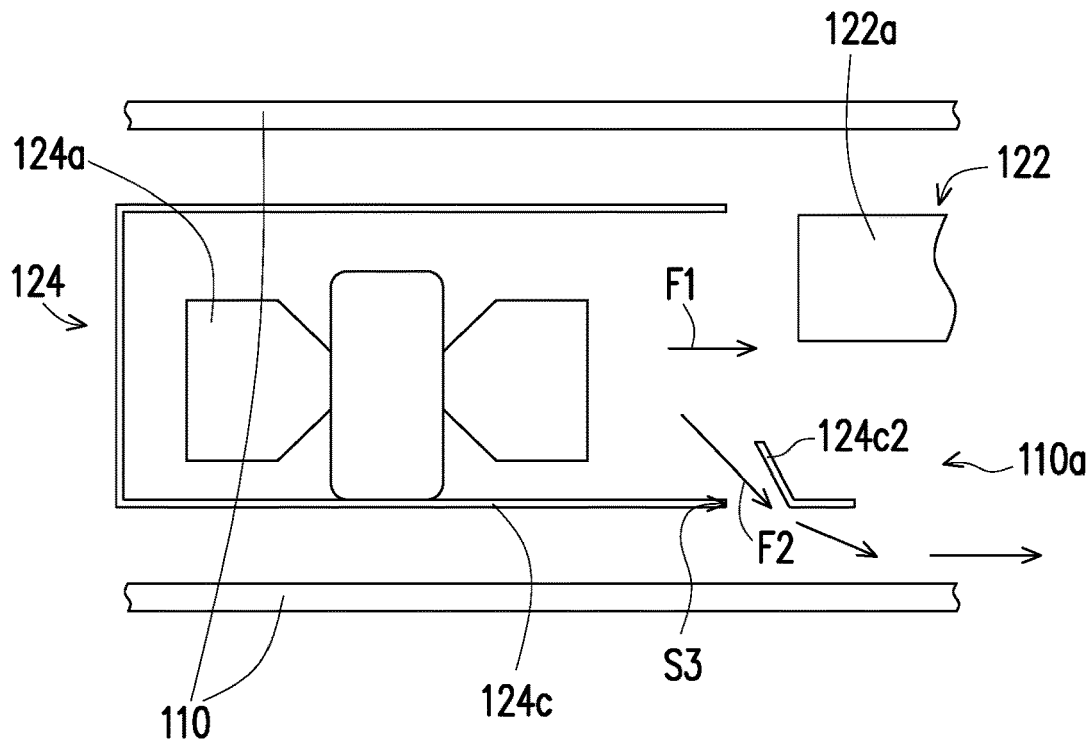
FIG. 8 is a partial schematic view of the electronic device according to another embodiment of the invention.

FIG. 8 is a partial schematic view of the electronic device according to another embodiment of the invention. The difference between the embodiment of FIG. 8 and the embodiment of FIGS. 1 to 4 is that, in the embodiment of FIG. 8, a slot S3 is formed on the housing 124c of the heat dissipation fan 124. The housing 124c has a tongue portion 124c2 adjacent to the slot S3 to form the air flow guiding portion, and the tongue portion 124c2 is tilted relative to the outflow direction (the direction of the heat dissipation air flow F1) of the heat dissipation fan 124, such that the heat dissipation air flow F2 passes through the slot S3 along a direction not parallel to (shown as tilted relative to) the outflow direction (the direction of the heat dissipation air flow F1) of the heat dissipation fan 124 by the guiding of the tongue portion 124c2 and then pass through the heat dissipation flow channel 110a. In further another embodiment, the slot S3 and the tongue portion 124c2 may be formed at the top side of the housing 124c while the slot S3 and the tongue portion 124c2 in the embodiment of FIG. 8 are formed at the bottom side of the housing 124c. In the embodiment, the tilted angle of the tongue portion 124c2 relative to the outflow direction of the heat dissipation fan 124 is, for example, 0 degree to 90 degree. In a preferable embodiment, the tilted angle of the tongue portion 124c2 may be 30 degree to 60 degree.

In summary, in the heat dissipation module according to the invention, the heat dissipation fan or the heat dissipation structure has the air flow guiding portion with the slot so that the heat dissipation air flow can flow to the heat dissipation flow channel between the heat dissipation portion and the casing via the slot. Thereby, heat dissipation efficiency of the heat dissipation fan with respect to the heat dissipation portion is improved. Moreover, the heat dissipation fan may perform heat dissipation on the casing to effectively lower the temperature of the casing. In addition, the heat dissipation fan may be detachably assembled to the extending portion of the heat dissipation structure, thus facilitating replacement and maintenance of the heat dissipation fan. In addition, by connecting the contact portion of the heat dissipation structure to the extending portion of the heat dissipation structure, the heat at the contact portion, which is produced by the heating element, may be transmitted to the heat dissipation portion of the heat dissipation structure not only via the heat pipe but also via the contact portion and the extending portion, thereby improving heat dissipation efficiency of the heat dissipation module with respect to the heating element. Furthermore, since the extending portion of the heat dissipation structure has thereon the directing portion configured to perform pressurization on the heat dissipation air flow, the heat dissipation fan itself does not require a directing portion, thus increasing flexibility in designing the heat dissipation module.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A heat dissipation module adapted for an electronic device, the heat dissipation module comprising:
   a heat dissipation structure disposed in a casing of the electronic device and having a heat dissipation portion, wherein a heat dissipation flow channel is formed between the heat dissipation portion and the casing; and
   the casing has a bottom surface;
   wherein the bottom surface of the casing is positioned horizontally; and
   a heat dissipation fan adjacent to the heat dissipation portion, wherein the heat dissipation fan or the heat dissipation structure has an air flow guiding portion, the air flow guiding portion has a slot, the slot is connected to the heat dissipation flow channel, the heat dissipation fan provides a heat dissipation air flow, and the air flow guiding portion guides a part of the heat dissipation air flow to pass through the slot along a direction not parallel to an outflow direction of the heat dissipation fan and then pass through the heat dissipation flow channel, wherein the heat dissipation structure has an extending portion to form the air flow guiding portion, the extending portion has the slot, the heat dissipation fan is detachably assembled to the extending portion and covers the slot, the heat dissipation flow channel is located beneath the heat dissipation portion, and the slot is located beneath the heat dissipation fan, wherein the heat dissipation fan runs lengthwise in a direction parallel to the bottom surface of the casing.

2. The heat dissipation module according to claim 1, wherein an end of a housing of the heat dissipation fan has a bent wall to form the air flow guiding portion, the bent wall is tilted relative to the outflow direction of the heat dissipation fan, and the slot is formed on the bent wall.

3. The heat dissipation module according to claim 1, wherein the slot is formed on a housing of the heat dissipation fan, the housing has a tongue portion adjacent to the slot to form the air flow guiding portion, and the tongue portion is tilted relative to the outflow direction of the heat dissipation fan.

4. The heat dissipation module according to claim 1, wherein the heat dissipation portion comprises heat dissipation fins.

5. The heat dissipation module according to claim 1, comprising a heat pipe disposed on the heat dissipation portion.

6. The heat dissipation module according to claim 1, wherein the heat dissipation structure has a contact portion, the contact portion contacts a heating element of the electronic device, and the extending portion is connected to the contact portion.

7. The heat dissipation module according to claim 1, wherein the heat dissipation structure has a directing portion formed on the extending portion, the heat dissipation fan comprises a fan blade structure, and a pressurization flow channel is formed between the directing portion and the fan blade structure.

8. The heat dissipation module according to claim 1, wherein the extending portion has a plurality of studs thereon, and the heat dissipation fan is detachably screwed to the studs.

9. An electronic device comprising:
a casing has a bottom surface;
wherein the bottom surface of the casing is positioned horizontally; and
a heat dissipation module comprising:
a heat dissipation structure disposed in the casing and having a heat dissipation portion, wherein a heat dissipation flow channel is formed between the heat dissipation portion and the casing; and
a heat dissipation fan adjacent to the heat dissipation portion, wherein the heat dissipation fan or the heat dissipation structure has an air flow guiding portion, the air flow guiding portion has a slot, the slot is connected to the heat dissipation flow channel, the heat dissipation fan provides a heat dissipation air flow, and the air flow guiding portion guides the heat dissipation air flow to pass through the slot along a direction not parallel to an outflow direction of the heat dissipation fan and then pass through the heat dissipation flow channel, wherein the heat dissipation structure has an extending portion to form the air flow guiding portion, the extending portion has the slot, the heat dissipation fan is detachably assembled to the extending portion and covers the slot, the heat dissipation flow channel is located beneath the heat dissipation portion, and the slot is located beneath the heat dissipation fan, wherein the heat dissipation fan runs lengthwise in a direction parallel to the bottom surface of the casing.

10. The electronic device according to claim 9, wherein an end of a housing of the heat dissipation fan has a bent wall to form the air flow guiding portion, the bent wall is tilted relative to the outflow direction of the heat dissipation fan, and the slot is formed on the bent wall.

11. The electronic device according to claim 9, wherein the slot is formed on a housing of the heat dissipation fan, the housing has a tongue portion adjacent to the slot to form the air flow guiding portion, and the tongue portion is tilted relative to the outflow direction of the heat dissipation fan.

12. The electronic device according to claim 9, wherein the heat dissipation portion comprises heat dissipation fins.

13. The electronic device according to claim 9, wherein the heat dissipation module comprises a heat pipe disposed on the heat dissipation portion.

14. The electronic device according to claim 9, wherein the heat dissipation structure has a contact portion, the contact portion contacts a heating element of the electronic device, and the extending portion is connected to the contact portion.

15. The electronic device according to claim 9, wherein the heat dissipation structure has a directing portion formed on the extending portion, the heat dissipation fan comprises a fan blade structure, and a pressurization flow channel is formed between the directing portion and the fan blade structure.

16. The electronic device according to claim 9, wherein the extending portion has a plurality of studs thereon, and the heat dissipation fan is detachably screwed to the studs.

* * * * *